United States Patent [19]

Loiseaux et al.

[11] 4,451,412

[45] May 29, 1984

[54] PROCESS FOR PRODUCING DIFFRACTING PHASE STRUCTURES

[75] Inventors: Brigitte Loiseaux; Jean P. Huignard; Jean C. Dubois; Armand Eranian, all of Paris, France

[73] Assignee: Thomson-CSF, Paris, France

[21] Appl. No.: 428,162

[22] Filed: Sep. 29, 1982

[30] Foreign Application Priority Data

Jan. 12, 1982 [FR] France .................................. 82 00371

[51] Int. Cl.³ .............................................. B29D 11/00
[52] U.S. Cl. ........................................ 264/1.3; 264/1.4; 350/162.2; 350/162.24
[58] Field of Search .......................... 264/1.3, 1.4, 108; 350/162.20, 162.24

[56] References Cited

U.S. PATENT DOCUMENTS 2,584,441  2/1952  Fredendall .......................... 264/108
2,668,328  2/1954  Porter .................................. 264/108
4,022,855  5/1977  Hamblen .............................. 264/1.4

FOREIGN PATENT DOCUMENTS 37-10935  8/1962  Japan .................................... 264/1.4

Primary Examiner—James B. Lowe
Attorney, Agent, or Firm—Oblon, Fisher, Spivak, McClelland & Maier

[57] ABSTRACT

This invention concerns a process for producing diffracting phase structures in an interaction medium, which is formed of microballs of material in suspension in a polymerizable liquid. When illumination rings have been recorded by the interference of two light waves, they are fixed in situ by exposing the mixture to ultraviolet radiation.

10 Claims, 6 Drawing Figures

PROCESS FOR PRODUCING DIFFRACTING PHASE STRUCTURES

BACKGROUND OF THE INVENTION

This invention concerns a process for producing diffracting-phase structures in a medium formed of microballs of dielectric material suspended in a liquid.

Products involving microballs of dielectric material in suspension in a liquid are already used to record index networks from interference rings. These recyclable media are used in dynamic functioning for real-time phase-conjugation applications.

The use of microballs of dielectric material in suspension in a liquid allows synthesization of high-resolution photosensitive media which function by index variation and require no development.

In addition, a medium of this type performs its recording function for all wavelengths, since the phase structure manufacturing process involves only the electric field of the incident light wave. This avoids the need for any change of wavelength between recording and reading.

The prior art therefore involves a dynamic medium, which is not fixed.

SUMMARY OF THE INVENTION

This invention proposes the use of such dielectric microballs in suspension in a polymerizable liquid, to produce diffraction phase structures requiring no development and which can be fixed in situ by exposure to energy radiation, such as ultraviolet radiation. This process thus produces a static medium, so that diffracting phase structures are thereby "memorized".

The invention concerns a process for producing diffracting phase structures comprising a medium formed of microballs of dielectric material in suspension in a liquid, in which two light waves interfere, the said process comprising one stage during which these two light waves are made to interfere in the medium, thereby recording their interference network in the medium, and, the liquid being polymerizable, a second stage in which the medium is solidified by exposing it to energy radiation, thereby fixing the interference network in situ.

BRIEF DESCRIPTION OF THE DRAWINGS

Other features and advantages of the invention will emerge from the following description, with reference to the accompanying figures.

DESCRIPTION OF THE PREFERRED EMBODIMENTS

Before explaining the different stages of this process, the methods used in the prior art, involving microballs of dielectric material in suspension in a liquid, will be described. When the refractive index nb of the surrounding medium is less than the refractive index na of microballs suspended in the liquid subjected to the electric field of the incident wave, the microballs are displaced by a force towards high-field regions of the incident wave-front.

The increased density of microballs in high-field regions increases the average refractive index in the material. Such a medium behaves very much like a medium with a positive Kerr $n_2$ optical coefficient. In the same way, when na is smaller than nb, the microballs are displaced towards low-field regions of the incident wave front, thereby changing the refractive index in a way similar to that of a medium with a positive $n_2$ index. These forces, resulting from illumination of the medium, are in opposition, because of thermal molecular (Brownian) movement of the microballs, which will tend to eliminate the optical system thereby created. Forces of gravity may be made negligible by selecting a liquid with a density sufficiently close to that of the microballs. In order to obtain a more or less uniform medium, the size of the microballs and the average space between them must be much smaller than the wavelength of the incident light.

This non-linear medium may be an aqueous medium, in which latex microballs, approximately 0.2 $\mu$m in diameter, are suspended.

Such a medium can be used to alter the properties of a non-linear optical system, and as a sensitive medium for wide-band real-time optical imagery.

By using smaller microballs, to obtain a finer-grained medium, it is possible to obtain the formation of a fine network, with the advantage of high picture resolution, lower energy requirements, and shorter response time.

Figure 1:
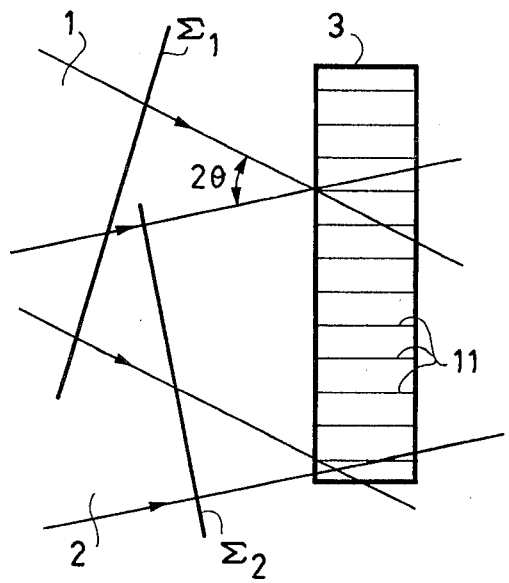
FIGS. 1 and 2, showing two layouts used in the prior art.
Figure 2:
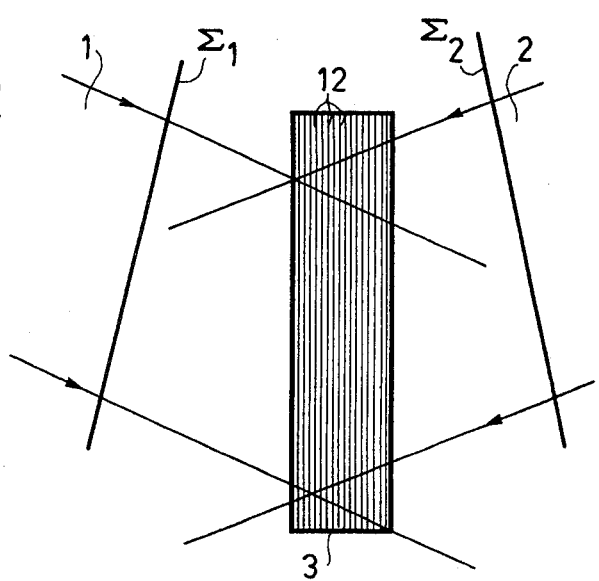

Recording of diffracting phase structures or rings takes place as follows. The index network is generated from a network of illumination rings resulting from the interference of two recording wave fronts, with two types of configurations:

"by transmission", as shown in FIG. 1: in other words, the two light waves (1 and 2) arrive from the same side of the medium (3);

"by reflection", as shown in FIG. 2, where the two waves (1 and 2) arrive on different sides of the medium (3), resulting in elementary reflections on rings parallel to the large surface of the medium, in which case the diffracted wave appears to be reflected on the front surface of the medium.

Interference of two wave fronts in an interaction medium allows diffracting phase structures to be recorded in volume without any spatial limitation of resolution. Registration of an elementary holographic network is obtained by the interference of two plane waves (1 and 2), with wave fronts $\Sigma_1$ and $\Sigma_2$ emitted by a laser. Spatial distribution of light intensity, generated within the volume of the crystal, is expressed by the equation:

$$I(x) = I_o\{1 + m \cos Kx\}$$

with $$m = \frac{2\sqrt{I_1 \times I_2}}{I_1 + I_2}$$

where m is the ring modulation rate $$K = 2\pi/\Lambda$$

where $\Lambda$ is the pitch of strata

By transmission, the pitch $\Lambda_T$ of the rings (11) is related to the angle between the two beams $2\theta$ by the following equation:

$$\Lambda_T = \lambda/(2 \sin \theta)$$

where
$\lambda$ is the registration wavelength
$\Lambda_T$ is typically equal to a few $\mu$m.

By reflection, on the other hand, the recording medium must possess very good resolution, since the pitch $\Lambda_R$ of the rings (12) is much smaller:

$$\Lambda_R = \lambda/(2n \cos \theta')$$

where $2\theta'$ is the angle between the two beams in the medium of index n; $\lambda = 0.5$ $\mu$m; n = 1.5:

$$\Lambda_R \sim \lambda/2n = 0.15 \, \mu m$$

Dielectric microballs are also available in very small sizes, for example with a diameter $\phi \sim 200$ Å, so that both types of network can be produced.

An aerosol of dielectric microballs can be used as non-linear optical medium. Functioning of such a material makes use of the effect on a dielectric microball of the electrical field $\vec{E}$ of the laser.

In an electrical field, such microballs behave like dipoles with $\vec{P}$ polarisation:

$$\vec{P} = Kr^3\vec{E}$$

where r = microball radius and K is a constant depending on the index of the microball and of the submersion medium.

In the case of a medium illuminated by a network of rings, the electrical field is spatially modulated. This field gradient induces a force, which causes displacement of the microballs between zones corresponding to dark and bright rings. $\vec{F} = \vec{grad}(\tfrac{1}{2}\vec{P} \times \vec{E}) = \tfrac{1}{2}Kr^3 \nabla(E^2)$ The accumulation of microballs creates an index variation $\Delta n$ in the medium, which generates the index network. This index change is proportional to the square of the electrical field:

$$\Delta n \propto E^2$$

Power conveyed by the laser is such that:

$$P = \tfrac{1}{2} n \frac{E^2}{Z}$$

where n is the medium index
and
$$Z = 1/\epsilon_o C = 377$$

where $\epsilon_o$ is the permittivity of the vacuum and C is the speed of light in vacuum.

Index networks recorded in a structure containing microballs have produced the following results:

$$\Delta n = 4 \cdot 10^{-4}$$

with $$P = 10^4 W/cm^2$$

for microballs with a radius $r = 0.12$ $\mu$m and the ring pitch $\Lambda = 3.5$ $\mu$m i.e. for a thickness d = 100 $\mu$m, a diffraction efficiency $\eta$:

$$\eta = \sin^2\left(\frac{\pi \Delta n \, d}{\lambda_o \cos \theta'}\right) = 87\%$$

where $\lambda_o = 0.5$ $\mu$m, and $\theta' = 45°$ in the external medium.

These properties depend mainly on the following parameters:
microball geometry and weight;
submersion medium viscosity;
incident power density.

After these remarks concerning the prior art, the process for producing diffracting structures proposed in this invention will be explained.

For the purposes of this process, the medium in which the dielectric microballs are suspended is formed of a photopolymerizable liquid; this permits the recorded structure to be fixed.

A monomer dissolved in a solvent may be used, such as acrylonitrile or methyl methacrylate or styrene, in ethanol (in which case the solvent must be allowed to evaporate), or else a composition containing one or more monomers, mixed or not with a reactive prepolymer such as butanediol diacrylate and/or hexanediol diacrylate and/or trimethylolpropane triacrylate and/or penta-erythritol triacrylate, with an epoxy-acrylic, or polyester-acrylic or polyurethane-acrylic prepolymer. In this case, the monomer or monomers play the part of reagent solvent, since they also polymerize by the addition of a photosensitizer such as benzoin or one of its derivatives, or benzophenone or one of its derivatives. The medium will polymerize by being exposed to energy radiation, for example ultraviolet rays.

Water-soluble monomers may also be used.

In this case, the recording medium is obtained by mixing the two ingredients, aqueous microball solution and monomer, directly together.

An acrylamide monomer, e.g., will be used with a diazoic compound such as 2.4-dichlorobenzene-diazonium-tetrafluoroborate or paradiethylamino-benzene-diazonium-tetrafluoroborate as photosensitizer. Diazoic compounds are a well-known family of chemical colouring agents.

Figure 3:
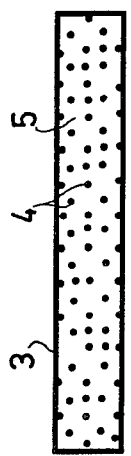
FIGS. 3, 4 and 5, showing different stages of the process proposed in this invention.
Figure 4:
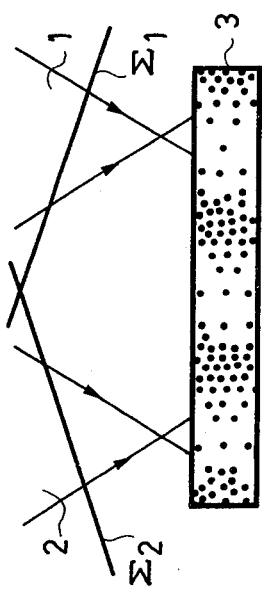

FIG. 3 shows a medium (3) obtained by suspending microballs (4) in a polymerizable liquid (5);

FIG. 4 shows the interference by transmission of two plane waves 1 and 2 with wave fronts $\Sigma_1$ and $\Sigma_2$.

Figure 5:
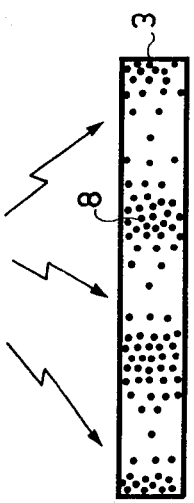

The recorded index networks, formed by accumulation of microballs producing diffracting structures, are then fixed in situ, as shown in FIG. 5, by being exposed, for example, to ultraviolet radiation.

Figure 6:
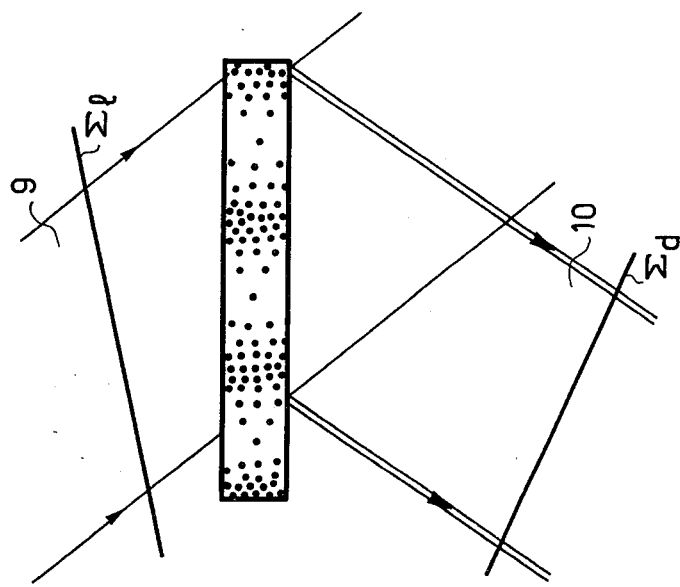
FIG. 6, illustrating the use of a structure produced by this process.

In FIG. 6, a medium of this kind is being read with a wave (9) with a wave front $\Sigma_e$, producing a diffracted wave (10) with a wave front $\Sigma_d$.

The microballs in the photopolymerizable liquid may, for example, be made of glass or latex.

Such medium can be used to produce small optical devices; in particular, no change of wavelength is needed between recording of the network and reading.

The use of microballs suspended in a liquid allows high-resolution photosensitive media to be synthesized, functioning by index variation and requiring no development. Submersion of such microballs in a polymerizable liquid makes it possible to obtain diffracting structures which can be fixed in situ, by exposing the mixture to radiation such as ultraviolet rays.

Such a medium can record for any wavelength, since the phase structure manufacturing process is related only to the electrical field of the light wave. This avoids the need for any change of wavelength between recording and reading.

Consequently, such a medium can be used to produce holographic optical components such as lenses or mirrors, and it is particularly suitable for recording of micro-optics for fibres.

What is claimed is:

1. A process for producing diffracting phase structures comprising a medium formed of microballs of dielectric material in suspension in a liquid, in which two light waves interfere, the said process comprising one stage during which these two light waves are made to interfere in the medium, thereby recording their interference network in the medium, and, the liquid being polymerizable, a second stage in which the medium is solidified by exposing it to energy radiation, thereby fixing the interference network in situ.

2. A process as defined in claim 1, in which the energy radiation is formed of ultraviolet rays.

3. A process as defined in claim 1, in which, in the first stage, the two light waves arrive from the same side of the medium, and interfere by transmission.

4. A process as defined in claim 1, in which, in the first stage, the two light waves arrive from opposite sides of the medium, and interfere by reflection.

5. A process as defined in claim 1, in which the microballs are made of latex.

6. A process as defined in claim 1, in which the microballs are made of glass.

7. A process as defined in claim 1, in which the polymerizable liquid contains a photosensitizer.

8. A process as defined in claim 7, in which the photosensitizer belongs to the family of diazoic compounds.

9. A process as defined in claim 7, in which the photosensitizer is benzoin or one of its derivatives.

10. A process as defined in claim 7, in which the photosensitizer is benzophenone or one of its derivatives.

* * * * *